(12) United States Patent
Abrams et al.

(10) Patent No.: US 10,547,937 B2
(45) Date of Patent: Jan. 28, 2020

(54) USER-CONTROLLED BEAM STEERING IN MICROPHONE ARRAY

(71) Applicant: Bose Corporation, Framingham, MA (US)

(72) Inventors: Darren W. Abrams, Stow, MA (US); William H. A. Voigt, Southborough, MA (US); Pelham Norville, Wayland, MA (US); William D. Rice, Wayland, MA (US); Noah J. Stupak, Arlington, MA (US); John A. Trotter, Sudbury, MA (US)

(73) Assignee: BOSE CORPORATION, Framingham, MA (US)

( * ) Notice: Subject to any disclaimer, the term of this patent is extended or adjusted under 35 U.S.C. 154(b) by 74 days.

(21) Appl. No.: 15/687,961

(22) Filed: Aug. 28, 2017

(65) Prior Publication Data

US 2019/0069080 A1 Feb. 28, 2019

(51) Int. Cl.

| H04R 1/40 | (2006.01) |
|---|---|
| G10L 21/0208 | (2013.01) |
| H03G 3/32 | (2006.01) |
| H04R 3/00 | (2006.01) |
| G06F 3/00 | (2006.01) |
| G06F 3/01 | (2006.01) |
| H04N 7/15 | (2006.01) |

(52) U.S. Cl.
CPC .......... *H04R 1/406* (2013.01); *G10L 21/0208* (2013.01); *H03G 3/32* (2013.01); *G06F 3/002* (2013.01); *G06F 3/017* (2013.01); *H04N 7/15* (2013.01); *H04R 3/005* (2013.01); *H04R 2420/07* (2013.01)

(58) Field of Classification Search
CPC .... H04R 1/406; H04R 3/005; H04R 2420/07; H04R 2430/20; G10L 21/0208; G10L 21/028; G10L 2021/02166; H03G 3/32; G06F 3/002; G06F 3/017; G06F 3/165; H04N 7/15; H04N 5/60; H04N 2005/4428
USPC ..... 381/92, 122, 91, 56, 58, 111; 455/556.1; 348/14.02, 14.16; 396/89
See application file for complete search history.

(56) References Cited

U.S. PATENT DOCUMENTS

| 6,836,243 B2 | 12/2004 | Kajala et al. | |
|---|---|---|---|
| 7,028,269 B1 * | 4/2006 | Cohen-Solal | G06K 9/3241 348/E5.043 |
| 7,995,771 B1 | 8/2011 | Faltys et al. | |

(Continued)

OTHER PUBLICATIONS

Invitation to Pay Additional Fee for International Application No. PCT/US2018/048061, dated Nov. 13, 2018, 14 pages.

(Continued)

*Primary Examiner* — Vivian C Chin
*Assistant Examiner* — Con P Tran
(74) *Attorney, Agent, or Firm* — Hoffman Warnick LLC

(57) ABSTRACT

Various aspects include approaches for controlling acoustic beams. In some particular aspects, a system includes: a microphone array; and a control system coupled with the microphone array, the control system programmed to control the microphone array by: processing a signal from a beacon device to identify a physical location of the beacon device relative to the microphone array; and focusing the microphone array in a direction based upon the physical location of the beacon device prior to receiving an audio input at the microphone array.

20 Claims, 6 Drawing Sheets

(56) References Cited

U.S. PATENT DOCUMENTS

| | | |
|---|---|---|
| 9,591,411 B2 | 3/2017 | Jensen et al. |
| 2003/0009329 A1 | 1/2003 | Stahl et al. |
| 2004/0001598 A1* | 1/2004 | Balan .................. G06K 9/0057 |
| | | 381/92 |
| 2004/0114772 A1 | 6/2004 | Zlotnick |
| 2005/0149320 A1* | 7/2005 | Kajala ................. G10L 21/0208 |
| | | 704/206 |
| 2008/0259731 A1 | 10/2008 | Happonen |
| 2011/0064232 A1 | 3/2011 | Ruwisch |
| 2012/0134507 A1* | 5/2012 | Dimitriadis .............. H04R 3/00 |
| | | 381/92 |
| 2014/0098240 A1 | 4/2014 | Dimitriadis et al. |
| 2015/0199172 A1* | 7/2015 | Ringuette ............... G06F 3/165 |
| | | 715/728 |
| 2015/0371529 A1 | 12/2015 | Dolecki |
| 2016/0142548 A1 | 5/2016 | Pandey et al. |
| 2017/0074977 A1* | 3/2017 | Koudar ............... G01S 7/52004 |

OTHER PUBLICATIONS

International Search Report and Written Opinion for International Application No. PCT/US2018/048061, dated Feb. 1, 2019, 21 pages.

* cited by examiner

USER-CONTROLLED BEAM STEERING IN MICROPHONE ARRAY

TECHNICAL FIELD

This disclosure generally relates to acoustic beam steering. More particularly, the disclosure relates to controlling beam direction in a microphone array based upon one or more user inputs.

BACKGROUND

Directionality in acoustic signals can greatly affect the user experience. In dynamic environments, where users and/or noise-generating devices move relative to a microphone array and/or speaker, systems that fail to adapt to changes in relative position may deliver an undesirable user experience.

SUMMARY

Various aspects of the disclosure include approaches for controlling acoustic beams. In a first aspect, a system includes: a microphone array; and a control system coupled with the microphone array, the control system programmed to control the microphone array by: processing a signal from a beacon device to identify a physical location of the beacon device relative to the microphone array; and focusing the microphone array in a direction based upon the physical location of the beacon device prior to receiving an audio input at the microphone array.

A second aspect of the disclosure includes an apparatus having: a microphone array; and a control system coupled with the microphone array, the control system programmed to: receive a command from a directional controller indicating a desired direction of focus for the microphone array; and focus the microphone array in the desired direction of focus prior to transmitting an audio output or receiving an audio input at the microphone array.

A third aspect of the disclosure includes a system having: a control system programmed to control a microphone array by: providing a prompt to initiate at least one noise source for sampling using the microphone array; receiving a set of noise source samples of the at least one noise source at the microphone array; creating a microphone array filter configured to at least partially reject the at least one noise source from the set of noise source samples; and storing the microphone array filter in a library of microphone array filters.

Two or more features described in this disclosure, including those described in this summary section, may be combined to form implementations not specifically described herein.

The details of one or more implementations are set forth in the accompanying drawings and the description below. Other features, objects and advantages will be apparent from the description and drawings, and from the claims.

Figure 1:
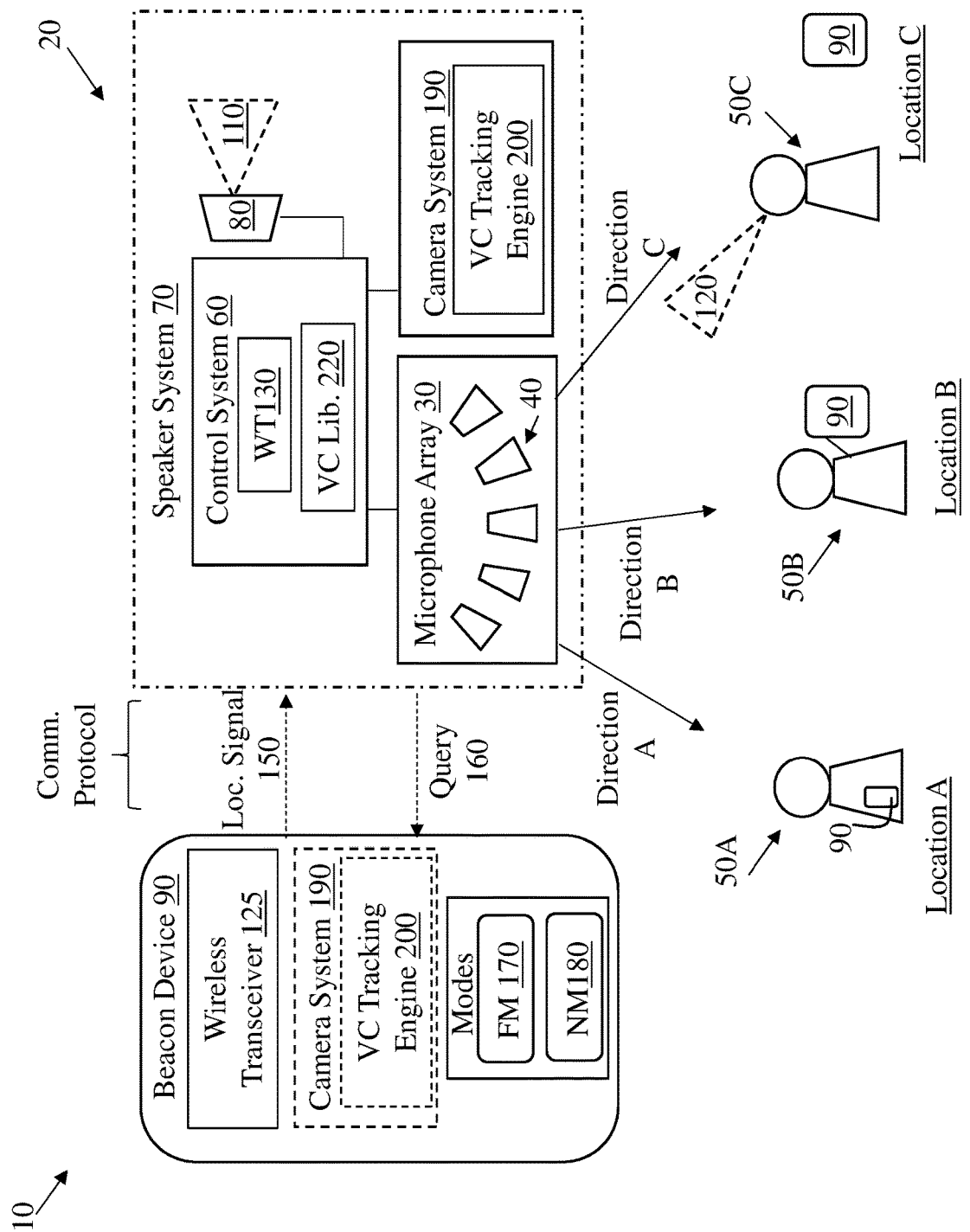
FIG. 1 shows a schematic depiction of an environment illustrating a microphone array control system according to various implementations.

It is noted that the drawings of the various implementations are not necessarily to scale. The drawings are intended to depict only typical aspects of the disclosure, and therefore should not be considered as limiting the scope of the invention. In the drawings, like numbering represents like elements between the drawings.

DETAILED DESCRIPTION

As noted herein, various aspects of the disclosure generally relate to acoustic beam steering. More particularly, aspects of the disclosure relate to controlling beam direction in a microphone array based upon one or more user inputs.

Commonly labeled components in the FIGURES are considered to be substantially equivalent components for the purposes of illustration, and redundant discussion of those components is omitted for clarity.

Various implementations of the disclosure include approaches for providing user control of microphone arrays to enhance user experiences and system responses. In conventional microphone systems, such as those used in virtual personal assistant systems (VPAs), voice user interface systems (VUIs), smart speaker systems, conferencing systems, etc., a control system dictates the direction of the beam formed by the microphone array (or, "microphone array beam," or simply, "beam") based upon an audio input, such as the voice of one or more users. The microphone array can detect voice directionality, e.g., that a user is speaking in a particular portion of the room, and the control system can use digital signal processing (DSP) to modify the direction of the beam in order to enhance the signal to noise ratio of the audio signal from that user.

However, these conventional systems limit the user's ability to direct the array, and can struggle to accurately parse commands and/or other audio signals through noise. In contrast to these conventional systems and approaches, various aspects of the disclosure include apparatuses and systems for controlling microphone array directionality through user-based commands. In some cases, a system configured to receive beacon signals is disclosed. This beacon-based system can adaptively direct a microphone array based upon the physical location of a beacon device. In particular cases, this beacon-based system can pre-select the direction of the beam formed by the microphone array based upon the beacon location, thereby enhancing signal quality and signal-to-noise ratio when compared with conventional systems which require an audio input signal to determine direction.

In some other cases, an apparatus is configured to receive signals from a (microphone) directional controller. This apparatus can be remotely controlled (e.g., in a remote physical location such as one separated from the microphone array by many miles), or may be locally controlled (e.g., within a localized region such as a single room, home or office). In some particular implementations, the directional controller can enable a remote user to control the direction of a microphone array in order to enhance the audio signal ultimately transmitted to that remote user at his/her remote location. As will be described herein, in various implementations, the directional controller can be used as a beacon.

In still other cases, a system is configured to interact with a user in order to sample noise sources and create customized microphone array filters for subsequently neutralizing those types of noise. This system can provide a prompt to the user or other system control in order to sample noise sources (e.g., common noise sources in a home, office or other environment), and can create and store specific microphone array filters for those noises for later implementation. It is understood that the term "user prompt" may not require a human user to initiate the noise sampling process. For example, in some cases, the "user" may be a robotic user, an artificial intelligence (AI) system or a control system configured to initiate the noise source in response to a prompt. In any case, this system can be configured to enhance audio signal quality at the microphone array by filtering specific noise signals.

FIG. 1 shows an illustrative environment 10 including a system 20 according to various implementations. System 20 can include a microphone array 30. The microphone array 30 can include a plurality of microphones 40 for receiving audio signals, e.g., such as commands from one or more users 50 (distinct users 50 shown as 50A, 50B, 50C, etc.). While a plurality of users 50 (e.g., 50A, 50B, 50C) are shown in various depictions, it is understood that the systems and apparatuses described according to various implementations may be utilized by a single user (e.g., 50A) moving between a plurality of locations (e.g., Location A, Location B, Location C). Microphone array 30 can be coupled with a control system 60 for modifying the beam direction of microphone array 30 based upon one or more conditions, as discussed herein. As noted herein, control system 60 can include conventional hardware and/or software components for executing program instructions or code according to processes described herein. For example, control system 60 may include one or more processors, memory, communications pathways between components, and/or one or more logic engines for executing program code. Control system 60 can be coupled with microphone array 30 via any conventional wireless and/or hardwired connection which allows control system 60 to send/receive signals to/from microphone array 30 and control operation thereof. In various implementations, control system 60 and microphone array 30 are collectively housed in a speaker system 70 (shown optionally in phantom), which may include a speaker 80 for transmitting audio signals to user(s) 50. Environment 10 can further include beacon device(s) 90 for providing location information to control system 60 according to processes described herein. Control system 60 is programmed to control microphone array 30 according to various approaches, as noted herein. For example, in one implementation as illustrated in FIG. 1, control system 60 is programmed to control microphone array 30 by: i) Processing a signal from the beacon device 90 to identify a physical location (e.g., Location A, Location B, Location C) of the beacon device 90 relative to the microphone array 30; and ii) Focusing the microphone array 30 in a direction (e.g., Direction A, Direction B, Direction C) based upon the physical location (e.g., Location A, Location B, Location C) of beacon device 90 prior to transmitting an audio output 110 or receiving an audio input 120 at the microphone array 30.

That is, system 20 can permit focusing of microphone array 30 without the need for an audio input 120 at microphone array 30 regarding a focus direction. This pre-focusing process can allow for improved signal quality in commands, transmissions, etc. from the desired direction (e.g., Direction A, Direction B, Direction C), as the microphone array 30 is already pre-positioned to focus on that direction based upon input from beacon device 90.

Beacon device 90 can include any device capable of being located within environment 10, and in some cases, can include at least one of: a Bluetooth beacon device, a mobile phone, an electronic tablet, a headset or headphones, a controller such as a game controller, a computing device, a global positioning system (GPS) transceiver, a wearable electronic device (e.g., smart watch, smart glasses, smart headphones or smart headsets) or a remote control with location-based capabilities. In some cases, beacon device 90 includes a wireless transceiver 125 (shown in one example beacon device 90 in FIG. 1) configured to communicate with a wireless transceiver (WT) 130 in the control system 60.

According to various implementations, beacon device 90 is movable across a plurality of physical locations (Location A, Location B, Location C, etc.) relative to the microphone array 30, and can provide information about its physical location (Location A, Location B, Location C, etc.) relative to microphone array 30. While multiple users 50A, 50B, 50C are shown at distinct locations (Location A, Location B, etc.) for illustrative purposes, it is understood that each user 50 could represent a single user (e.g., 50A) moving between locations. Additionally, different types of beacon devices 90 are illustrated in FIG. 1, e.g., a smaller wearable beacon device 90 on user 50A, a hand-held beacon device 90 connected with user 50B. At location C, a tag-style beacon 90 could be used to designate this location within environment 10 according to various implementations.

In some cases, beacon device 90 can include an electronic device configured to communicate with control system 60 directly, or via a communications protocol (or, network), such as any conventional wireless communications protocol. In some cases, communications protocol can include a Wi-Fi protocol using a wireless local area network (LAN), a communication protocol such as IEEE 802.11 b/g a cellular network-based protocol (e.g., third, fourth or fifth generation (3G, 4G, 5G cellular networks) or one of a plurality of internet-of-things (IoT) protocols, such as: Bluetooth, BLE Bluetooth, ZigBee (mesh LAN), Z-wave (sub-GHz mesh network), 6LoWPAN (a lightweight IP protocol), LTE protocols, RFID, ultrasonic audio protocols, etc.

In various implementations beacon device 90 sends a location signal 150 to control system 60 (e.g., via one or more communications protocols described herein) indicating the physical location (Location A, Location B, etc.) of beacon device 90 relative to control system 60. In some particular cases, control system 60 logs or otherwise stores location information (Location A, Location B, etc.) about beacon device(s) 90 from a location signal 150 until a later location signal 150 is received from the beacon device(s) 90. This process may allow control system 60 to direct the microphone array 30 in a direction (Direction A, Direction B, etc.) without polling or otherwise querying beacon device(s) 90. In various implementations, beacon device 90 is configured to operate in two distinct modes: active mode and passive mode. In passive mode, beacon device 90 remains in a sleep (non-signaling) configuration until it receives a ping or other location-requesting signal from speaker system 70 (e.g., a location-based ping). In active mode, beacon device 90 is configured to continuously or periodically send location signals without requiring a ping or other location-requesting signal from speaker system 70. Additionally, passive v. active modes can be controlled or otherwise modified through a software application stored or otherwise implemented (e.g., via cloud-based retrieval) in control system 60 and/or on beacon device 90, such that control system 60 sends a query signal 160 to beacon device 90 whenever beacon device 90 switches from a passive mode to an active mode; and beacon device 90 may respond with a location signal 150 updating the location information (Location A, Location B, etc.) about beacon device 90. Additionally, or alternatively, the software application may cause beacon device 90 to switch from passive mode to active mode and send location signal 150 whenever beacon device 90 moves within environment 10, e.g., moves a distance that exceeds a threshold distance.

Location signals 150 can include data indicating a location of beacon device 90, and can be sent via one or more location-based protocols. For example, as noted herein, beacon device 90 can include a wireless transceiver 125 for communicating with a wireless transceiver 130 in control system 60. In some cases, beacon device 90 can include a Bluetooth beacon device configured to communicate (e.g., via location signals 150) with a Bluetooth transceiver at control system 60. In other cases, beacon device 90 can include a global positioning system (GPS) transceiver or satellite-based transceiver configured to send location signals 150 to control system 60. In still other implementations, beacon device 90 can include a Wi-Fi access point location system (e.g., including an antenna array on beacon device 90 and/or speaker system 70) configured to transmit location signals 150 via Wi-Fi to indicate the location of beacon 90 within a Wi-Fi network range. In some particular implementations, wireless transceiver 130 on speaker system 70 can include an antenna configured to detect signal direction from location signals 150. In still other embodiments, speaker system 70 and/or beacon device 90 can include an infra-red locator for detecting the direction of location signals 150. Additionally, microphone array 30 may be used for ultrasonic detection to indicate the location of beacon device 90 relative to speaker system 70.

According to various implementations, one or more beacon device(s) 90 can include a focus mode (FM) 170 for pre-focusing the microphone array 30 toward the beacon device 90, or a negation mode (NM) 180 for pre-focusing the microphone array 30 away from the beacon device 90. That is, in some configurations, each beacon device 90 can be designated as a "focus" beacon or a "negation" beacon. These modes can allow control system 60 to pre-focus microphone array 30 on particular beacon device(s) 90 or negate other beacon device(s) 90. In some cases, the mode (e.g., focus mode 170 or negation mode 180) for one or more beacon devices 90 is pre-set prior to beacon device 90 sending a location signal 150 to control system 60. This could allow for use of beacon devices 90 as labels on particular areas, people, devices, etc., of interest or disinterest in terms of microphone directionality. For example, a user 50 may employ a beacon device 90 (e.g., his/her mobile phone, tablet, smart glasses, earpiece, hearing aid, smart watch) set on focus mode 170 in order to continuously update the direction of microphone array 30 to "follow" the user 50 as he/she moves within environment 10. This may enhance the user's experience and provide greater quality of the audio input 120 to microphone array 30. In another example, a user 50 may couple a beacon device 90 (e.g., electronic tag, RFID tag, Wi-Fi tag) set to negation mode 180 with an area of a home where user(s) 50 are unlikely to be located, e.g., a room where few people congregate. In still other examples, a user 50 may couple a beacon device 90 (e.g., electronic tag, RFID tag, Wi-Fi tag) set to negation mode 180 with a noise source that may not interact with (or intend to interact with) the speaker system 70, such as a device, person and/or thing (e.g., a vacuum, home theater system, a child or a dog).

In some cases, speaker system 70 and/or beacon device 90 can include a camera system 190 configured to detect a visual characteristic (e.g., a presence, location, proximity, identity and/or gesture) of one or more users 50. In some cases, camera system 190 is located only at speaker system 70 for detecting the visual characteristic (e.g., gestures or identity) of user(s) 50, e.g., across a room or a space. However, as shown in phantom in FIG. 1, and in the additional detailed depiction of control system 60 in FIG. 2, in some cases beacon device 90 can also (or alternatively) include a camera system 190, e.g., where beacon device 90 is a smart phone, wearable electronic device (e.g., smart watch, smart glasses, smart headphones or smart headsets) or other portable camera-enabled system. In any case, camera system 190 can be configured to detect a visual characteristic (e.g., presence, location, proximity, identity and/or gesture) of one or more user(s) 50. In various implementations, camera system 190 can be actively enabled, e.g., via user prompt, to track visual characteristics of one or more user(s) 50. In one particular implementation, camera system 190 can include a visual characteristic (VC) tracking engine 200 for processing image data captured at camera system 190 on beacon device 90 and/or at speaker system 70.

According to various implementations, control system 60 is programmed or otherwise configured to: receive a camera signal from camera system 190 which indicates the visual characteristic of user 50 (e.g., a gesture such as a wave of the hand, or other significant motion); and focus the microphone array 30 in response to the visual characteristic of the user 50 matching a visual characteristic in a stored visual characteristic library (VC Lib) 220 (locally stored or remotely accessible via any conventional network interface or communications protocol described herein). Stored VC library 220 may also include a thresholding mechanism (e.g., logic, or a relational database with indexing) for comparing a camera signal (e.g., from camera system 190 at beacon device 90 and/or at speaker system 70) with pre-sorted video or image data to determine whether the visual characteristic of the user 50 is linked with a focus direction for the microphone array 30.

In some cases, where the visual characteristic includes a gesture, user motion which exceeds a certain threshold may trigger a camera signal from camera system 190 to control system 60 (e.g., via connection between camera system 190 and control system 60, or via beacon device 90). In these examples, a user 50 could wave a left arm to indicate a desire to direct the microphone array 30 to the user's left-hand side. Where the movement of that left arm is significant enough to trigger VC tracking engine 200 (e.g., such that movement range is greater than a threshold distance such as one or two feet), and a camera signal is sent to control system 60, control system 60 can compare that camera signal with image or video data in VC library 220 that is user-specific or generic to a plurality of users to determine a characteristic of the visual data, e.g., in the case of a gesture, the direction of the gesture and an intent if the gesture (e.g., that the gesture indicates an intention to focus the microphone array 30 in a particular direction). It is understood that in various particular implementations, the "gesture" can include a physical gesture such as movement of an arm, leg, torso, head, etc., but can also (or alternatively) include a facial gesture (e.g., movement of an eyebrow, change in direction of gaze). In some of these cases, the facial gaze of a user 50 can be detected, e.g., using a retina detection feature in camera system 190, in order to detect that the user 50 is looking directly at camera system 190. This application may be beneficial, for example, in some communications settings (e.g., video conferencing), as well as when user 50 engages with a virtual assistant. In some particular implementations, control system 60 includes logic for comparing camera signals from camera system(s) 190 (at beacon device 90 and/or speaker system 70) with image or video data in VC library 220, including, e.g., image recognition logic to determine that the user 50 is intentionally making a particular gesture for controlling the focus of the microphone array 30.

As noted herein, in other examples, the visual characteristic (e.g., visual characteristic of user 50) can include one or more of a presence of a user 50, a proximity of a user 50 to one or more other reference items (e.g., speaker system 70, beacon device(s) 90 or other user(s) 50), a location of one or more user(s) 50 or an identity of a user 50. In some of these cases, the VC tracking engine 200 can be configured to detect the identity of a user 50, using image data from camera system 190 (e.g., either periodically or continuously obtained image data), and indicate the location of the identified user 50. In these example implementations, VC tracking engine 200 could visually identify the user 50 as he/she moves through an environment, and send an indication of that location to control system 60 in order to dynamically update the focus direction of the microphone array 30. In still other examples, the beacon device 90 can utilize its camera system 190 to identify (and in some cases, track) a user 50. For instance, a user 50 can direct the camera on a beacon device 90 (e.g., smartphone, tablet, wearable smart device) toward himself/herself, or to a particular other user (e.g., user 50A, user 50B, or user 50C), and VC tracking engine 200 can be trained to identify the user(s), e.g., via image capture and recognition and/or artificial intelligence (AI)-based training.

Figure 2:
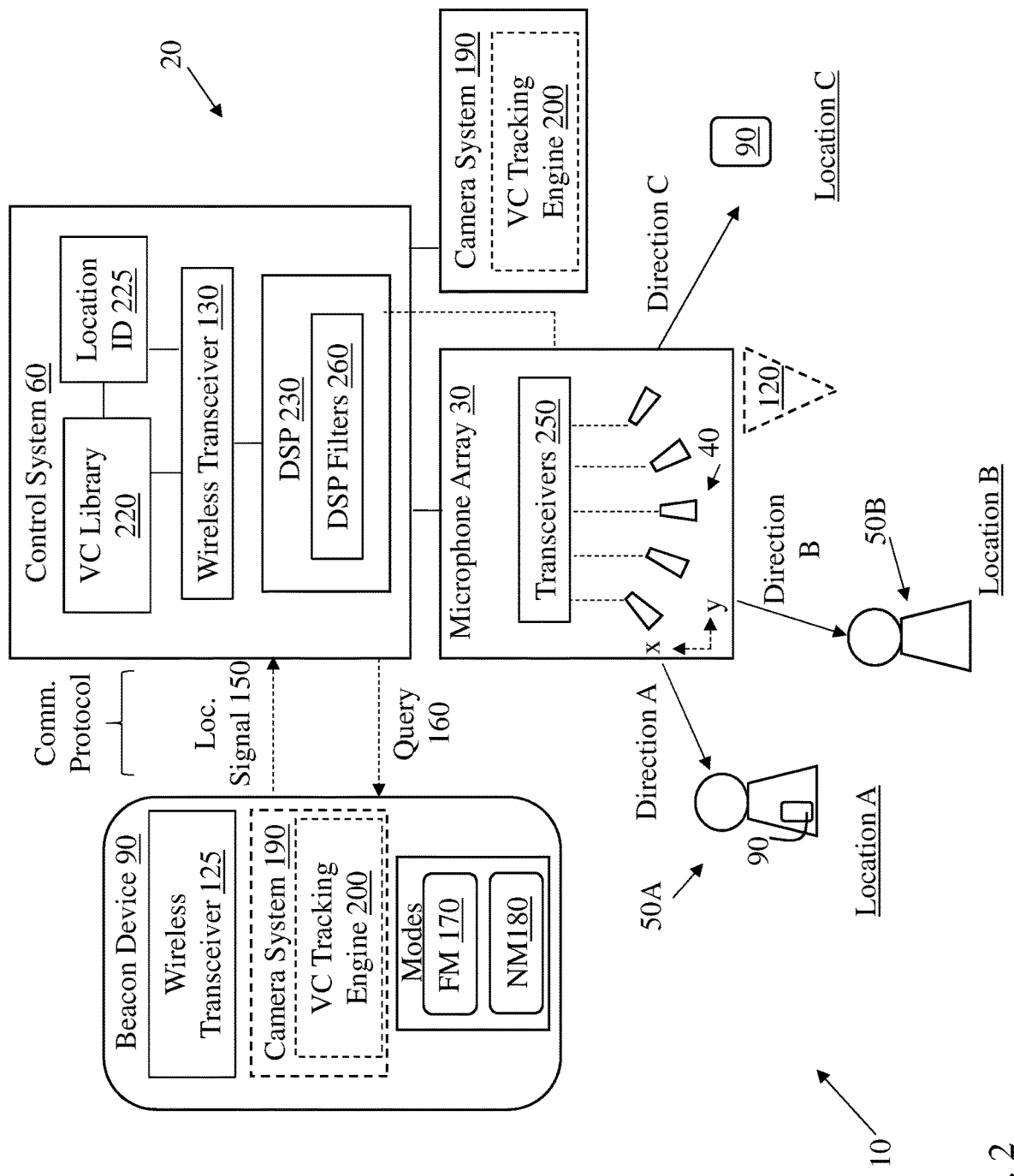
FIG. 2 shows a close-up depiction of portions of the microphone array control system of FIG. 1.

It is understood that a single beacon device 90 (at Location A) in FIGS. 1 and 2 is illustrated in greater detail than other beacon devices 90 (e.g., at Location B or Location C) merely for simplicity of illustration. It is further understood that any beacon device 90 shown and described herein may have some or all of the capabilities of that beacon device 90 shown at Location A in FIGS. 1 and 2.

Turning to FIG. 2, and with continuing reference to FIG. 1, control system 60 and microphone array 30 are shown in greater detail to describe additional implementations of the disclosure. As shown in FIG. 2, control system 60 can further include a location identification (Location ID) engine 225 for detecting the location of beacon device 90 within environment 10. That is, according to various implementations, location identification engine 225 is configured to process location signal(s) 150 for one or more beacon device(s) 90 in order to determine where in environment beacon device 90 is located (e.g., Location A, Location B, Location C or any other location). That is, location identification engine 225 can include logic for processing data about one or more location signals 150 received via one or more location protocols described herein. For example, location identification engine 225 may include logic for processing Bluetooth location data, Wi-Fi location data, video (camera) data, etc. to determine a location for each beacon device 90. In particular implementations, location identification engine 225 can rely upon multiple location protocols to identify and/or verify a location of beacon device(s) 90.

Control system 60 can further include a digital signal processor (DSP) 230 for modifying the focus direction of the microphone array 30 according to various implementations described herein. That is, DSP 230 can be configured to modify the focus direction (Direction A, Direction B, etc.) of the microphone array 30 in the direction toward the physical location (Location A, Location B, etc.) of beacon device 90, or in a direction (Direction B, Direction C, etc.) away from the physical location (Location A, Location B, etc.) of beacon device 90 based upon one or more indicators from beacon device 90 (e.g., focus mode 170 or a negation mode 180, camera signal including visual characteristic information). Microphone array 30 can include a plurality of microphones 40, which may each include a conventional receiver for receiving audio signals (e.g., audio input signal 120). In some cases, microphones 40 can include one or more directional microphones. However, in other cases, each microphone 40 in the array 30 can include an omnidirectional microphone configured to be directed by digital signal processor 230. DSP 230 can be coupled with microphones 40 (and/or wireless transceiver 130) and include one or more DSP filters 260 for processing audio input 120 and/or audio output 110 in order to control the direction of the array 30, e.g., by DSP beamforming. DSP beamforming is a known technique for summing the input (e.g., audio input 120) from multiple directions to achieve a narrower response to input(s) 120 from a particular direction (e.g., Direction A, Direction B, etc.). FIG. 2 illustrates an example curved microphone array 30 including a plurality of microphones 40 arranged along an arcuate path, each having an x and y coordinate value.

Figure 3:
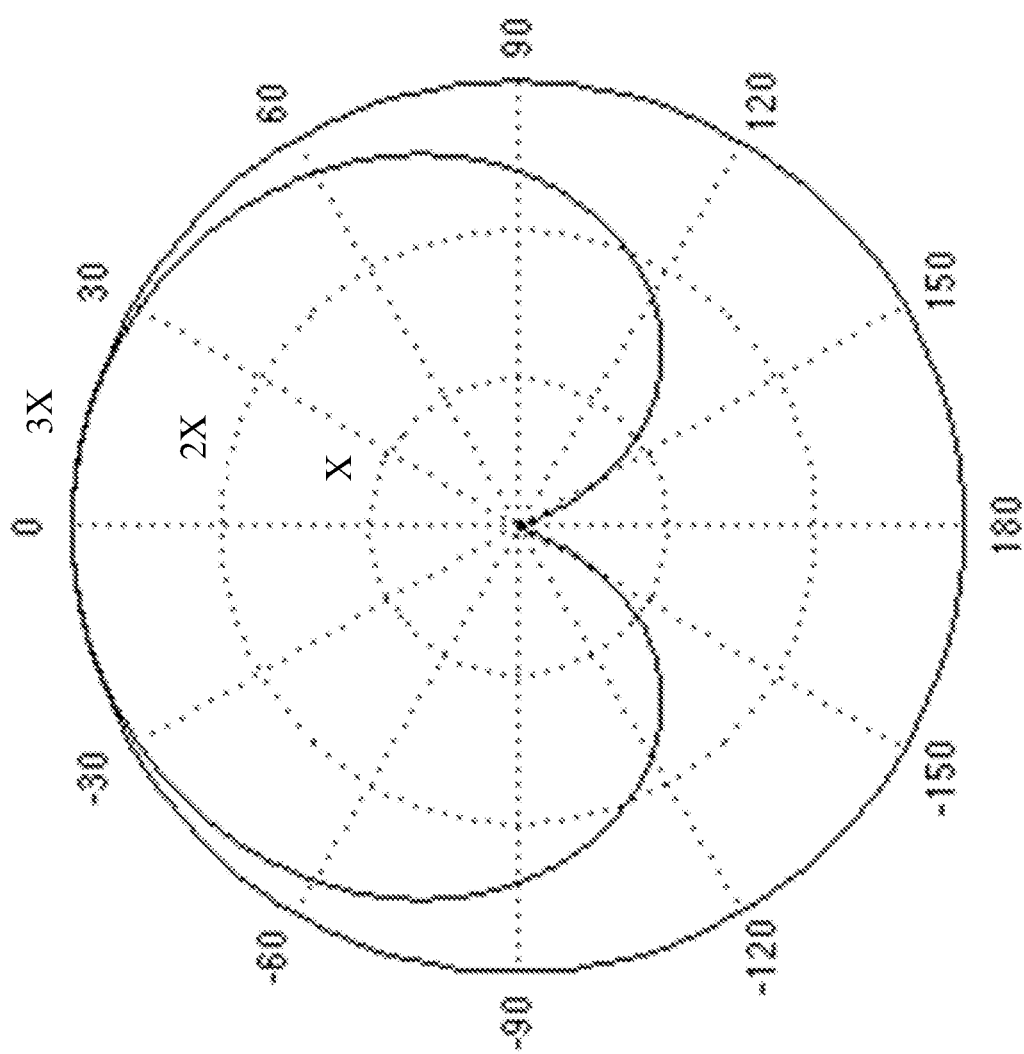
FIG. 3 is an example polar plot illustrating aspects of microphone array control.
Figure 4:
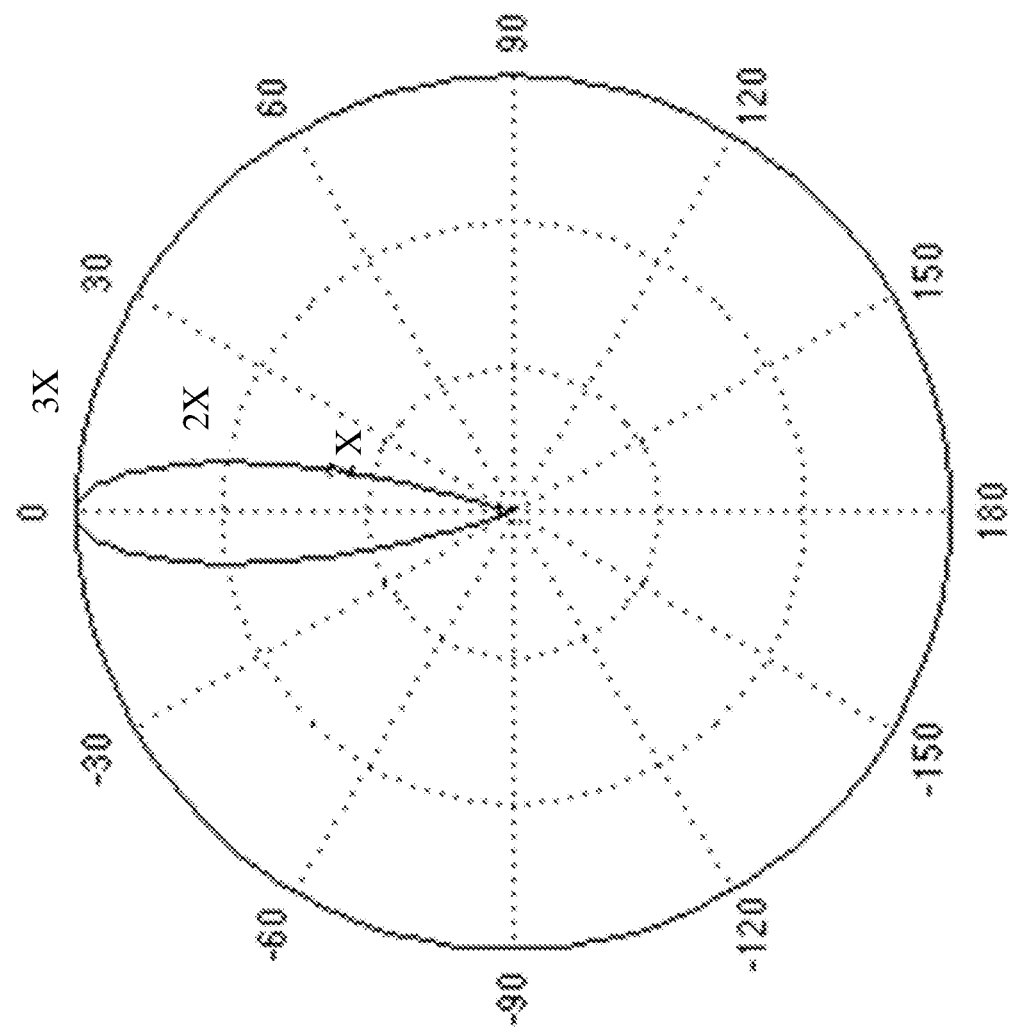
FIG. 4 is an example polar plot illustrating a control process for modifying the polar plot of FIG. 3.

An example response from a given environment (without beamforming) at microphones 40 is shown in the polar graphical depiction of FIG. 3, where the desired pointing direction (e.g., Direction A, FIGS. 1 and 2) is called the maximum response angle (MRA), the angle in the polar graph of FIG. 3 is the off-set from that MRA, and the radius is the amplitude response in that MRA direction. FIG. 4 illustrates a filtered response at microphones 40 with DSP filters 260 applied to direct the microphone array 30 in a particular direction (e.g., the MRA direction, which can be dictated by the location of beacon device(s) 90, visual characteristic tracking at beacon device(s) 90, etc.).

Figure 5:
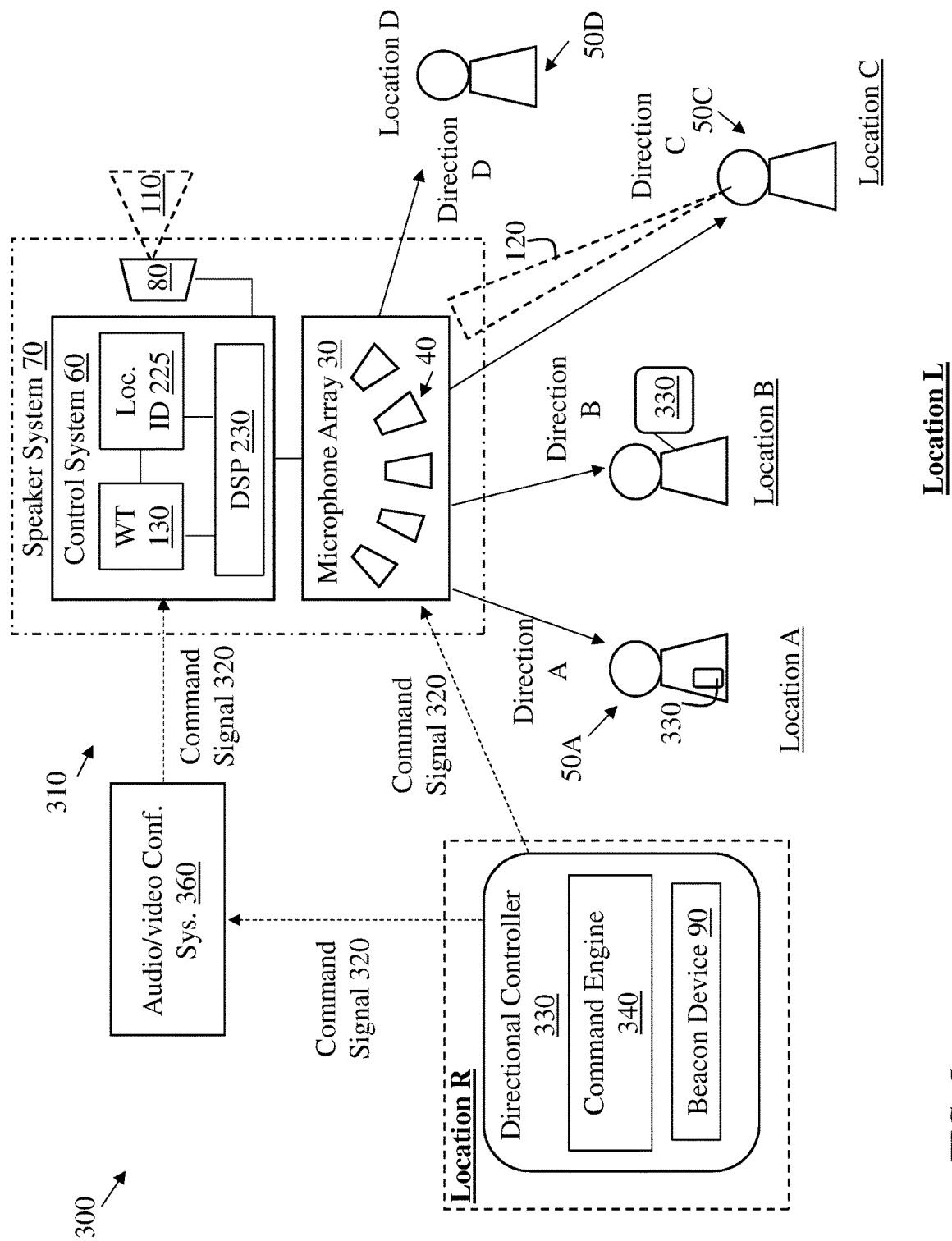
FIG. 5 shows a schematic depiction of an environment illustrating a microphone array control system according to various additional implementations.

FIG. 5 shows a schematic depiction of another environment 300, including an apparatus 310 configured to control a microphone array 30 according to various additional implementations. For example, apparatus 310 can include a microphone array 30 (as described with respect to microphone array 30 in FIG. 1 and FIG. 2), and a control system 60 (as described with respect to control system 60 in FIG. 1 and FIG. 2). Additionally, as shown in FIG. 5, control system 60 is configured to: A) receive a command (command signal) 320 (either directly or via a communications protocol) from a directional controller 330 indicating a desired direction of focus (e.g., Direction A, Direction B) for microphone array 30; and B) focus the microphone array 30 in the desired direction (e.g., Direction A, Direction B) prior to transmitting audio output 110 or receiving audio input 120.

In this implementation, in contrast to FIG. 1, apparatus 310 may be configured to interact with directional controller 330, which may include a beacon device 90 (with some or all of the functionality described herein), but may also include a command engine 340 for dictating a number of directions of microphone array 30 using an active command signal 320. For example, in some cases, directional controller 330 can be contained in, or form a part of, an audio conferencing system or a video conferencing system (audio/video conferencing system) 360 (which may utilize one or more communications protocols described herein), and may be located at a remote geographic location (Location R) from microphone array 30. In these cases, directional controller 330 can send a command signal 320 through audio/video conferencing system 360 (or directly to control system 60) indicating a desired direction of focus (Direction A, Direction, B, etc.) for the microphone array 30. In these cases, a user 50 can control the direction of microphone array 30 from a remote geographic location (Location R), for example, when communicating with another user 50 who is in the same general location (Location L, or local location) as the microphone array 30. This apparatus 310 may be beneficial to the remote user 50 when one or more users 50 are present at Location L, and the remote user 50 wishes to pre-focus the microphone array 30 on a particular user 50 (e.g., Direction A, Direction B, etc.). This apparatus 310 may also be beneficial where one or more users 50 at Location L will move around within that location during an audio/video conference. It is understood that as used herein, the term "conference" may include any designated communication between users 50, including, e.g., video chat, audio call, virtual reality/augmented reality (VR/AR) chats, audio/video overlay, etc. In various implementations, the conference application can include any conventional conferencing system such as a chat system, audio-conferencing system or video-conferencing system, e.g., using protocol(s) such as voice over IP (VoIP), voice over LTE (VoLTE), or WebRTC.

Figure 6:
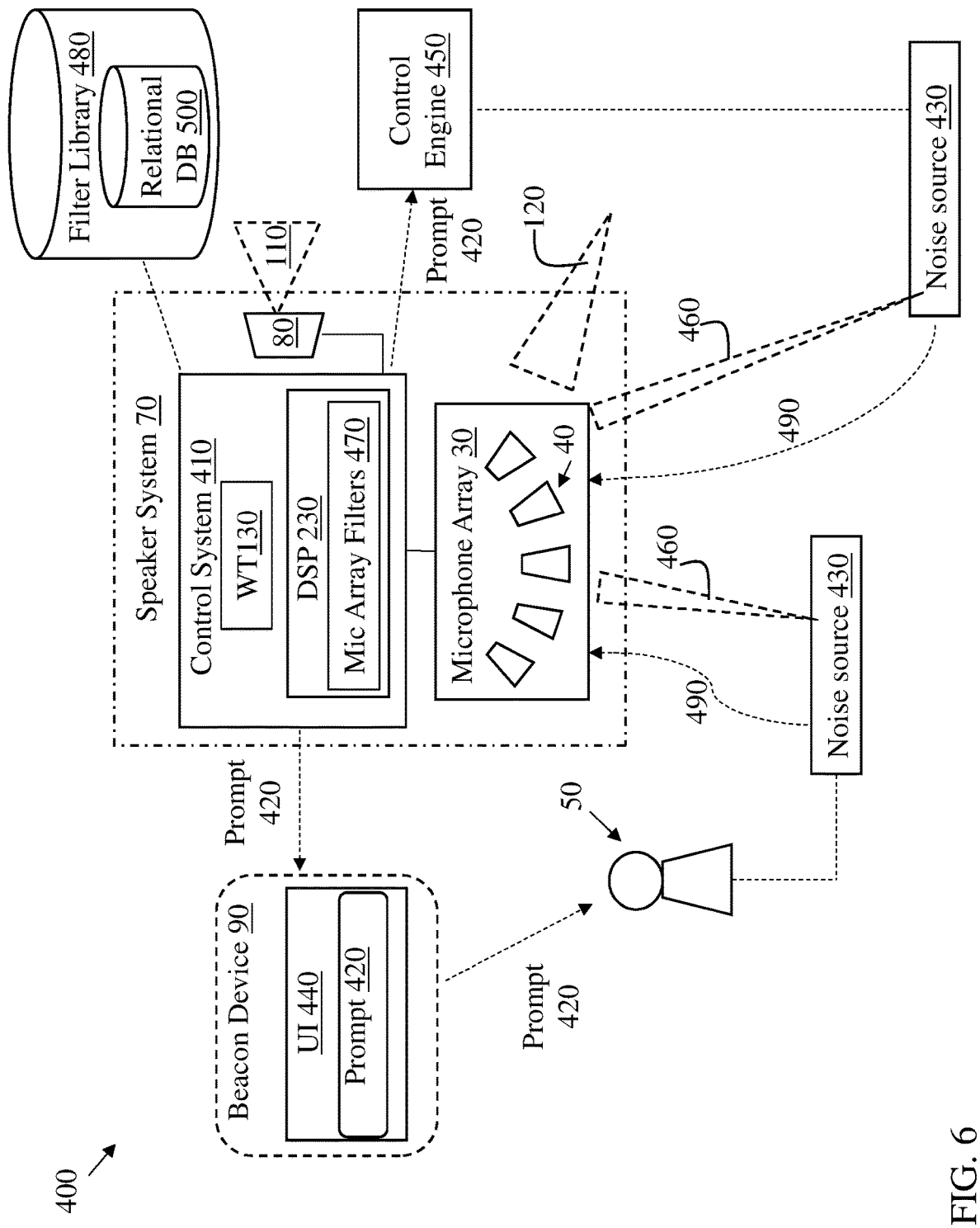
FIG. 6 shows a schematic depiction of a microphone array control system according to various further implementations.

In yet another embodiment, as illustrated in the schematic depiction of FIG. 6, a system 400 can be configured to provide customized noise filtering for particular applications. That is, in various implementations, system 400 can include a control system 410 programmed to control a microphone array 30 (similar to microphone array 30 described with reference to FIG. 1) by:

A) Providing a prompt 420 to initiate at least one noise source 430 for sampling using the microphone array 30. In some cases, this can include providing the prompt 420 to a user 50, e.g., as an audio prompt and/or via a user interface (UI) 440 (which may include any conventional UI on an electronic device having interface capabilities, e.g., smartphone, wearable electronic device (e.g., smart watch, smart glasses, smart headphones or smart headsets), or other device similar to beacon device 90 described herein), or to another control engine 450 (e.g., control system for noise-generating devices in a home, office or other environment) for controlling one or more noise sources 430. Prompt 420 may request that user 50 or control engine 450 initiate the noise source(s) 430 for sampling by microphone array 30 during a sampling period, e.g., within a prescribed time such as 10-15 seconds or one or two minutes (as non-limiting examples). The prompt 420 can request that user 50 or control engine 450 power on the noise source 430 or otherwise initiate noise from noise source 430, and may request additional information about the noise source 430, such as the type of device generating the noise, e.g., the make and/or model of the device generating the noise. For example, noise source 430 could include a vacuum cleaner, a heating/ventilating/air-conditioning (HVAC) unit, a food processor, etc., and prompt 420 may request that one or more of these noise sources 430 be individually operated (and potentially, operated within a certain range such as a High setting, Low setting, etc., or for a particular period) in order to gather information about these noise sources 430. At the input stage, prompt 420 could ask user 50 to provide information about the type of noise source 430, such as by selecting a type of the source 430 from a menu.

B) After prompting user 50 and/or control engine 450 to initiate noise source 430, microphone array 30 can receive a set of noise source samples 460 of noise source(s) 430. Noise source samples 460 may include audio signals from noise source(s) 430 taken over a period, or at one or more particular operating levels (e.g., High, Low, full volume, partial volume). Noise source samples 460 will include spectral content for each noise source 430, and can be categorized by device and/or noise spectrum (frequency) for later filtering.

C) From the noise source samples 460, control system 410 can create one or more microphone array filters (mic. array filters) 470 configured to at least partially reject the noise source(s) 430. Control system 410, when paired with microphone array 30, can be configured to identify audio signals from noise source 430 and apply microphone array filters 470 to at least partially reject the noise source 430. In some cases, creating the set of microphone array filters 470 includes categorizing the noise source samples 460 according to at least one of frequency or amplitude, and correlating control instructions for modifying a gain on the microphone array 30 with the categorized noise source samples 460. For example, the microphone array filters 470 can include frequency-dependent filters selected to knock out (interfere with) frequencies along a particular spectrum for one or more noise sources 430.

D) Storing the microphone array filters 470 in a library 480 for later use in filtering noise sources 430. It is understood that library 480 could be a local library in a common geographic location as one or more portions of control system 410, or may be a remote library stored at least partially in a distinct location or in a cloud-based server. It is further understood that library 480 could include a plurality of microphone array filters 470 for a plurality of noise sources 430 from distinct users 50 or profiles. In this sense, library 480 could store microphone array filters 470 which are applicable to specific users 50 or profiles, but may also store microphone array filters 470 that can be used by distinct users 50 or profiles, e.g., where a noise source 430 is common to multiple users 50 and/or profiles.

E) In some cases, in response to detecting audio noise signals 490 (similar to noise source sample signals 460), control system 410 is further configured to apply microphone array filters 470 during at least one of receiving an audio input 120 at microphone array 30 or transmitting an audio output signal 110 at speaker 80 (e.g., where control system 410 is part of speaker system 70). That is, in various implementations, when control system 410 receives an audio input signal 120 or sends an audio output signal 110 (e.g., to user 50) and detects an audio noise signal 490, control system 410 can apply one or more microphone array filters 470 from library 480 to filter (e.g., interfere with) that audio noise signal 490. In some particular cases, control system 410 can modify the direction of microphone array 30 according to the stored microphone array filter 470 in response to detecting the noise source 430 (audio noise signal 490).

In various implementations, library 480 can include a relational database (relational DB) 500 including relationships between the microphone array filter(s) 470 and the set of noise source samples 460. In some cases, library 480 could also include a text index for noise sources, e.g., with pre-set or user-definable categories. This could allow the user (e.g., in response to prompt 420) to provide information about the type of noise source 430, such as by selecting a type of the source 430 from a menu (e.g., provided in UI 440 or at control engine 450). Control system 410 can further include a learning engine (e.g., an artificial intelligence component such as an artificial neural network) configured to learn about the type of source selected, e.g., from a group of users' noise sources 430 (e.g., washing machines or vacuum cleaners).

Control system 410 can include a DSP 230 (similar to DSP described with reference to FIGS. 1-4) for comparing audio noise signal 490 with noise source samples 460 stored in the library 480, and can modify the gain on the microphone array 30 in response to the audio noise signal 490 matching at least one of those noise source samples 460. In particular, control system 410 can utilize DSP 230 to modify a gain and a direction of the microphone array 30 in order to knock out (interfere with) the noise from noise source.

The functionality described herein, or portions thereof, and its various modifications (hereinafter "the functions") can be implemented, at least in part, via a computer program product, e.g., a computer program tangibly embodied in an information carrier, such as one or more non-transitory machine-readable media, for execution by, or to control the operation of, one or more data processing apparatus, e.g., a programmable processor, a computer, multiple computers, and/or programmable logic components.

A computer program can be written in any form of programming language, including compiled or interpreted languages, and it can be deployed in any form, including as a stand-alone program or as a module, component, subroutine, or other unit suitable for use in a computing environment. A computer program can be deployed to be executed on one computer or on multiple computers at one site or distributed across multiple sites and interconnected by a network.

Actions associated with implementing all or part of the functions can be performed by one or more programmable processors executing one or more computer programs to perform the functions of the calibration process. All or part of the functions can be implemented as, special purpose logic circuitry, e.g., an FPGA and/or an ASIC (application-specific integrated circuit). Processors suitable for the execution of a computer program include, by way of example, both general and special purpose microprocessors, and any one or more processors of any kind of digital computer. Generally, a processor will receive instructions and data from a read-only memory or a random access memory or both. Components of a computer include a processor for executing instructions and one or more memory devices for storing instructions and data.

In various implementations, components described as being "coupled" to one another can be joined along one or more interfaces. In some implementations, these interfaces can include junctions between distinct components, and in other cases, these interfaces can include a solidly and/or integrally formed interconnection. That is, in some cases, components that are "coupled" to one another can be simultaneously formed to define a single continuous member. However, in other implementations, these coupled components can be formed as separate members and be subsequently joined through known processes (e.g., soldering, fastening, ultrasonic welding, bonding). In various implementations, electronic components described as being "coupled" can be linked via conventional hard-wired and/or wireless means such that these electronic components can communicate data with one another. Additionally, sub-components within a given component can be considered to be linked via conventional pathways, which may not necessarily be illustrated.

Other embodiments not specifically described herein are also within the scope of the following claims. Elements of different implementations described herein may be combined to form other embodiments not specifically set forth above. Elements may be left out of the structures described herein without adversely affecting their operation. Furthermore, various separate elements may be combined into one or more individual elements to perform the functions described herein.

We claim:

1. A system comprising:
a microphone array; and
a control system coupled with the microphone array, the control system programmed to control the microphone array by:
processing a signal from a beacon device to identify a physical location of the beacon device relative to the microphone array; and
focusing the microphone array in a direction based upon the physical location of the beacon device prior to receiving an audio input at the microphone array, wherein the beacon device includes a negation mode for pre-focusing the microphone array away from the beacon device.

2. The system of claim 1, wherein the beacon device further includes a focus mode for pre-focusing the microphone array toward the beacon device.

3. The system of claim 1, wherein the beacon device is pre-set to the negation mode prior to sending the signal indicating the physical location of the beacon device.

4. The system of claim 1, further comprising a camera system connected with the control system, the camera system for detecting a visual characteristic of a user, the control system further programmed to:
receive a camera signal from the camera system indicating the visual characteristic of the user; and
focus the microphone array in response to the visual characteristic of the user matching a visual characteristic in a stored visual characteristic library.

5. The system of claim 2, wherein the control system includes a digital signal processor for modifying the focus direction of the microphone array toward the physical location of the beacon device or away from the physical location of the beacon device.

6. The system of claim 1, wherein the beacon device includes a first wireless transceiver configured to communicate with a second wireless transceiver in the control system, and wherein the beacon device is movable across a plurality of physical locations relative to the microphone array.

7. The system of claim 1, wherein the beacon device includes at least one of: a mobile phone, an electronic tablet, a controller, a computing device, a global positioning system (GPS) transceiver, a wearable electronic device or a remote control.

8. An apparatus comprising:
a microphone array; and
a control system coupled with the microphone array, the control system programmed to:
receive a command from a directional controller indicating a desired direction of focus for the microphone array; and
focus the microphone array in the desired direction of focus prior to receiving an audio input at the microphone array, wherein the directional controller includes a beacon device including a negation mode for pre-focusing the microphone array away from the beacon device.

9. The apparatus of claim 8, wherein the beacon device further includes a focus mode for pre-focusing the microphone array toward the beacon device.

10. The apparatus of claim 9, further comprising a camera system connected with the control system, the camera system for detecting a visual characteristic of a user, the control system further programmed to:
receive a camera signal from the directional controller indicating the visual characteristic of the user; and
focus the microphone array in response to the visual characteristic of the user matching a visual characteristic in a stored visual characteristic library.

11. The apparatus of claim 8, wherein the directional controller includes a wireless transceiver configured to communicate with a wireless transceiver in the control system, and wherein the directional controller is movable across a plurality of physical locations relative to the microphone array.

12. The apparatus of claim 8, wherein the directional controller includes a user-wearable device for tracking movement of a user, and wherein the desired direction of focus for the microphone array is modifiable based upon the movement of the user.

13. The apparatus of claim 8, wherein the microphone array is contained within a video conferencing system or an audio conferencing system.

14. A system comprising:
a control system programmed to control a microphone array by:
providing a prompt to initiate at least one noise source for sampling using the microphone array;
receiving a set of noise source samples of the at least one noise source at the microphone array;
creating a microphone array filter configured to at least partially reject the at least one noise source from the set of noise source samples; and
storing the microphone array filter in a library of microphone array filters.

15. The system of claim 14, wherein the control system is further configured to apply the microphone array filter during at least one of transmitting or receiving an audio signal at the microphone array in response to detecting the at least one noise source.

16. The system of claim 15, wherein the library of microphone array filters includes a relational database including relationships between the microphone array filter and the set of noise source samples.

17. The system of claim 16, wherein applying the microphone array filter includes:
receiving an audio noise signal at the microphone array;
comparing the audio noise signal with the set of noise source samples in the library of microphone array filters; and
modifying a gain on the microphone array in response to the audio noise signal matching at least one of the set of noise source samples.

18. The system of claim 14, wherein creating the set of microphone array filters includes categorizing the noise source samples according to at least one of frequency or amplitude, and correlating control instructions for modifying a gain on the microphone array with the categorized noise source samples.

19. The system of claim 14, wherein the prompt includes a user prompt instructing a user to activate the at least one noise source during a sampling period.

20. The system of claim 14, wherein the control system modifies the direction of the microphone array according to the stored microphone filter in response to detecting the at least one noise source.

* * * * *